(12) United States Patent
Shirali

(10) Patent No.: US 7,362,821 B1
(45) Date of Patent: Apr. 22, 2008

(54) METHOD AND APPARATUS FOR AMPLIFIER LINEARIZATION USING ADAPTIVE PREDISTORTION

(75) Inventor: Kedar Shirali, Sunnyvale, CA (US)

(73) Assignee: Marvel International Ltd., Hamilton (BM)

( * ) Notice: Subject to any disclaimer, the term of this patent is extended or adjusted under 35 U.S.C. 154(b) by 29 days.

(21) Appl. No.: 11/412,637

(22) Filed: Apr. 27, 2006

Related U.S. Application Data

(63) Continuation of application No. 10/153,554, filed on May 22, 2002, now Pat. No. 7,085,330.

(51) Int. Cl.
H04L 25/03 (2006.01)

(52) U.S. Cl. .................. 375/297; 375/285; 455/67.1; 455/115; 455/125

(58) Field of Classification Search .......... 375/285, 375/295–297; 455/50.1, 63, 67.1, 67.3, 115, 455/120, 125, 126
See application file for complete search history.

(56) References Cited

U.S. PATENT DOCUMENTS

| | | | |
|---|---|---|---|
| 4,291,277 | A | 9/1981 | Davis et al. |
| 4,967,164 | A | 10/1990 | Sari |
| 5,049,832 | A | 9/1991 | Cavers |
| 5,107,520 | A | 4/1992 | Karam et al. |
| 5,148,448 | A | 9/1992 | Karam et al. |
| 5,253,272 | A | 10/1993 | Jaeger et al. |
| 5,486,789 | A | 1/1996 | Palandech et al. |
| 5,760,646 | A | 6/1998 | Belcher et al. |
| 5,892,397 | A | 4/1999 | Belcher et al. |
| 5,900,778 | A | 5/1999 | Stonick et al. |
| 5,910,965 | A | 6/1999 | Ierfino |
| 5,929,703 | A | 7/1999 | Sehier et al. |
| 6,075,411 | A | 6/2000 | Briffa et al. |
| 6,078,216 | A | 6/2000 | Proctor, Jr. |
| 6,108,385 | A | 8/2000 | Worley, III |
| 6,118,335 | A | 9/2000 | Nielsen et al. |
| 6,236,837 | B1 | 5/2001 | Midya |
| 6,240,278 | B1 | 5/2001 | Midya |
| 6,252,912 | B1 | 6/2001 | Salinger |
| 6,275,685 | B1 | 8/2001 | Wessel et al. |

(Continued)

FOREIGN PATENT DOCUMENTS

EP 0 387 948 A1 9/1990

(Continued)

OTHER PUBLICATIONS

Sundstrom, Lars, et al., Effects of Reconstruction Filters in Digital Predistortion Linearizers for RF Power Amplifiers, IEEE Transactions on Vehicular Technology, Feb. 1995, pp. 131-139, vol. 44, No. 1, IEEE US.

(Continued)

Primary Examiner—Dac V. Ha

(57) ABSTRACT

A distortion correction circuit comprises memory that stores N samples of an input signal that occur at N different times, where N is an integer greater than two. A self-receiver samples an output signal that is generated by an RF power amplifier and that is based on said input signal. A synchronization unit selects one of said N samples by comparing said sampled output signal to said N samples. A predistortion unit generates a distortion correction function based on said selected one of said N samples and said output signal.

39 Claims, 6 Drawing Sheets

U.S. PATENT DOCUMENTS

| | | | |
|---|---|---|---|
| RE37,407 E | 10/2001 | Eisenberg et al. | |
| 6,298,096 B1 | 10/2001 | Burgin | |
| 6,298,097 B1 | 10/2001 | Shalom | |
| 6,320,463 B1 | 11/2001 | Leva et al. | |
| 6,836,517 B2 | 12/2004 | Nagatani et al. | |
| 6,985,704 B2 * | 1/2006 | Yang et al. | 455/126 |
| 7,184,490 B1 * | 2/2007 | Rybicki et al. | 375/297 |
| 2001/0004223 A1 | 6/2001 | Kim | |

FOREIGN PATENT DOCUMENTS

| | | |
|---|---|---|
| EP | 0 387 948 B1 | 8/1994 |
| EP | 0 380 167 B1 | 8/1995 |
| WO | WO 98/04034 A1 | 1/1998 |
| WO | WO 98/28888 A1 | 7/1998 |
| WO | WO 00/01065 A1 | 1/2000 |
| WO | WO 02/15389 A1 | 2/2002 |

OTHER PUBLICATIONS

Sundstrom, Lars, et al., Quantization Analysis and Design of a Digital Predistortion Linearizer for RF Power Amplifiers, IEEE Transactions on Vehicular Technology, Nov. 1996, pp. 707-719, vol. 45, No. 4, IEEE US.

Cavers, James K., The Effect of Quadrature Modulator and Demodulator Errors on Adaptive Digital Presidtorters for Amplifier Linearization, IEEE Tranactions on Vehicular Technology, May 1997, pp. 456-466, vol. 46, No. 2, IEEE, US.

Faulkner, Michael, et al., Adaptive Linearization Using Predistortion—Experimental Results, IEEE Transactions on Vehicular Technology, May 1994, pp. 323-332, vol. 43, No. 2, IEEE, US.

Zavosh, Frank, et al., Digital Predistortion JTechniques for RF Power Amplifiers with CDMA Applications, Microwave Journal, Oct. 1999, Horizon House Publications, US.

Andreani, P., et al., Chip for Wideband Digital Predistorion RF Power Amplifier Linearization, Electronics Letters, May 22, 1997, pp. 925-926, vol. 33, No. 11, IEE, UK.

D'Andrea, Aldo N., et al. A Digital Approach to Efficient Rf Power Amplifier Linearization, Proc. of IEEE Globe COLMM '97, 1997, pp. 77-81, IEEE, US.

Johnson, Daniel Eric, Adaptive Digital Predistortion with Applications for LMDS Systems, Aug. 25, 2000, Virginia Polytechnic Institute and State University, US.

ANSI/IEEE, Std. 802.11, 1999 Edition, Part 11: Wireless LAN Medium Access Control (MAC) and Physical Layer (PHY) Specifications, Aug. 20, 1999, IEEE, US.

IEEE Std 802.11a-1999 (Supplement to IEEE Std 802.11-1999) [Adopted by. ISO/IEC and redesignated as ISO/IEC 8802-11: 1999/Amd 1:2000(E)]; Supplement to IEEE Standard for Information technology—Telecommunications and information exchange between systems—Local and metropolitan area networks—Specification requirements—Part 11: Wireless LAN Medium Access Control (MAC) and Physical Layer (PHY) specifications High-speed Physical Layer in the 5 GHz Band; LAN/MAN Standards Committee of the IEEE Computer Society; 91 pages.

IEEE Std 802.11b-1999 (Supplement to IEEE Std 802.11-1999 Edition); Supplement to IEEE Standard for Information technology—Telecommunications and information exchange between systems—Local and metropolitan area networks—Specific requirements—Part 11: Wireless LAN Medium Access Control (MAC) and Physical Layer (PHY) specifications: Higher-Speed Physical Layer Extension in the 2.4 GHz Band; LAN/MAN Standards Committee of the IEEE Computer Society; Sep. 16, 1999 IEEE-SA Standards Board; 96 pages.

IEEE Std 802.11g/D2.8, May 2002 (Supplement to ANSI/IEEE Std 802.11, 1999 Edition) DRAFT Supplement to STANDARD [for] information Technology—Telecommunications and information exchange between systems—Local and metropolitan area networks—Specific requirements—Part 11: Wireless LAN Medium Access Control (MAC) and Physical Layer (PHY) specifications: Further Higher-Speed Physical Layer Extension in the 2.4 GHz Band; LAN/MAN Standards Committee of the IEEE Computer Society; 53 pages.

* cited by examiner

METHOD AND APPARATUS FOR AMPLIFIER LINEARIZATION USING ADAPTIVE PREDISTORTION

CROSS-REFERENCE TO RELATED APPLICATIONS

This application is a continuation of U.S. patent application Ser. No. 10/153,554 filed on May 22, 2002, which application claims the benefit of U.S. Provisional Application No. 60/357,317, filed on Feb. 15, 2002. The disclosure of the above application is incorporated herein by reference.

TECHNICAL FIELD

This invention relates to wireless communications, and is particularly concerned with improving amplifier linearization using adaptive predistortion techniques.

BACKGROUND OF THE INVENTION

The past few years has witnessed the ever-increasing availability of relatively cheap, low power wireless data communication services, networks and devices, promising near wire speed transmission and reliability. One technology in particular, described in the IEEE Standard 802.11a (1999) and Draft IEEE Standard 802.11g (2002) High Rate PHY Supplements to the ANSI/IEEE Standard 802.11, 1999 edition, collectively incorporated herein fully by reference, has recently been commercialized with the promise of 54 Mbps effective bandwidth in the less crowded 5 GHz band, making it a strong competitor to traditional wired Ethernet and the more ubiquitous "802.11b" or "WiFi" 11 Mbps wireless transmission standard.

IEEE 802.11a and 802.11g compliant transmission systems achieve their high data transmission rates using OFDM encoded symbols mapped up to 64 QAM multicarrier constellation. Before final power amplification and transmission, the multicarrier OFDM symbol encoded symbols are converted into the time domain using Inverse Fast Fourier Transform techniques resulting in a relatively high-speed time domain signal with a large peak-to-average ratio (PAR).

The large PAR characteristic of this transmission signal makes it difficult to use sub-class A RF power amplification without significant back-off due to nonlinear effects of such power amplifiers, which reduces generated signal strength, effective range, and, ultimately utility as a wireless transmission system. Class A amplifiers are too power inefficient market for mobile users where wireless transmission has the highest penetration, so ways to extend the linear response of more power efficient sub Class A power amplifiers are currently being explored.

Known techniques to extend the nonlinear performance of sub Class A amplifiers when faced with amplifying high-speed, high PAR signals include digitally clipping and otherwise compressing the PAR values of such signals. This brings up the effective transmission gain up 2-3 db typical since PAR is compressed, but still does not provide sufficient extended range over non-implementing systems and can indirectly reduce effective throughput in IEEE 802.11a & 802.11g compliant systems, because such systems will reduce transmission rates in an effort to compensate for reception errors in fringe reception environments.

Therefore, the wireless industry has turned to adaptive predistortion in an attempt to actually extend the linear gain and phase response of power efficient Class AB and other designs. Known adaptive predistortion techniques compare the output of the power amplifier against the input signal to determine e.g. gain and phase nonlinearities between the two, create an predistortion correction function to process the input signal to counteract those nonlinearities when they are experienced. Typically, a predistorter using a signal processor, lookup table, or a combination thereof interposes the input and the amplifier to implement the adaptive predistortion.

One obstacle to implementing a successful predistortion design with respect to high-speed, high-PAR signal transmission as required by the IEEE 802.11a & g physical layer standards has been the issue of accounting for the delay it takes to self-receive the output of the power amplifier after a given input signal has been fed to the predistorter. Note here that in order for adaptive predistortion to be successful, it is important that the output signal at the power amplifier be compared to its corresponding input signal to great temporal precision. Accounting for this delay still appears to be a black art fraught with trial-and-error, since it appears that designers simply approximate the delay from the input to the predistorter to the output of the self-receiver based on implementing component delays and then verifying and tweaking their designs through trial-and-error until the experienced delay is found and accommodated. Further, this design approach appears to disregard or minimize the importance of changing power levels and frequencies of the input signal which may alter the self-receive delays, as well as other potential delay altering issues, such as component aging, environmental effects, and interference.

SUMMARY OF THE INVENTION

To address these and related problems, the present invention is directed to a signal processing method and apparatus capable of correcting signal distortion introduced by an RF power amplifier, which includes the use of a buffer to store a plurality of samples representing at least a portion of an input signal intended for amplification by the RF power amplifier, the use of a self-receiver to receive an output signal generated by the RF power amplifier, the use of a synchronization unit to determine, as a matching input sample, which of the stored plurality of samples corresponds most closely to the output signal, and the use of a predistortion unit to selectively apply a distortion correction function to the input signal prior to amplification by the RF power amplifier in which the distortion correction function being derived from a relationship between the matching input sample and the output signal.

In accordance with a disclosed embodiment of the invention, the self-receiver may include an analog-to-digital converter to realize a sample of the output signal. Moreover, the synchronization unit may include a correlation unit which correlates a characteristic, such as a magnitude, for each of the stored samples against a similar characteristic of the realized sample of the output signal.

Consistent with an aspect of the invention, a phase offset correction unit can be provided to correct a phase offset in the realized sample of the output signal relative to the matching input symbol; and the predistortion unit can be arranged to include an adaptation unit to derive the distortion correction function based on a relationship between the matching input sample and the phase offset corrected realized sample of the output signal.

Consistent with another aspect, a sampling phase error correction unit may be provided to generate sampling alteration information to the analog-to-digital converter to cause this analog-to-digital converter to selectively alter sampling of the output signal. In this aspect, the correlation unit may used to generate a first correlation result for one of stored samples immediately preceding the matching input sample in the buffer, as well as to generate a second correlation result for one of the stored samples immediately proceeding the matching input sample in this buffer. In such case, the sampling phase error correction unit may generate the sampling alteration information based on a relationship between these first and second correlation results.

Consistent with yet an additional aspect of the invention, the aforementioned synchronization unit may include a convergence determination unit to determine when a convergence condition has occurred with respect to determination of the matching input sample relative to the aforementioned buffer.

By finding the matching sample to a self-received sample in the buffer, methods and apparatus according to the present invention permit more precise and updateable determination of the delays involved in the RF modulation and amplification stages of the amplifier and the self-receiver, thus allowing for more precise and aggressive adaptive predistortion to be used. This ultimately results in an RF power amplifier having a more linear gain response, which is useful for e.g. extending the range of wireless communications systems, and also allow the incorporation of less expensive but less linear RF power amplifier circuitry in cost-conscious configurations.

Additional aspects and advantages of this invention will be apparent from the following detailed description of embodiments thereof, which proceeds with reference to the accompanying drawings.

DETAILED DESCRIPTION OF THE EMBODIMENTS

Figure 1:
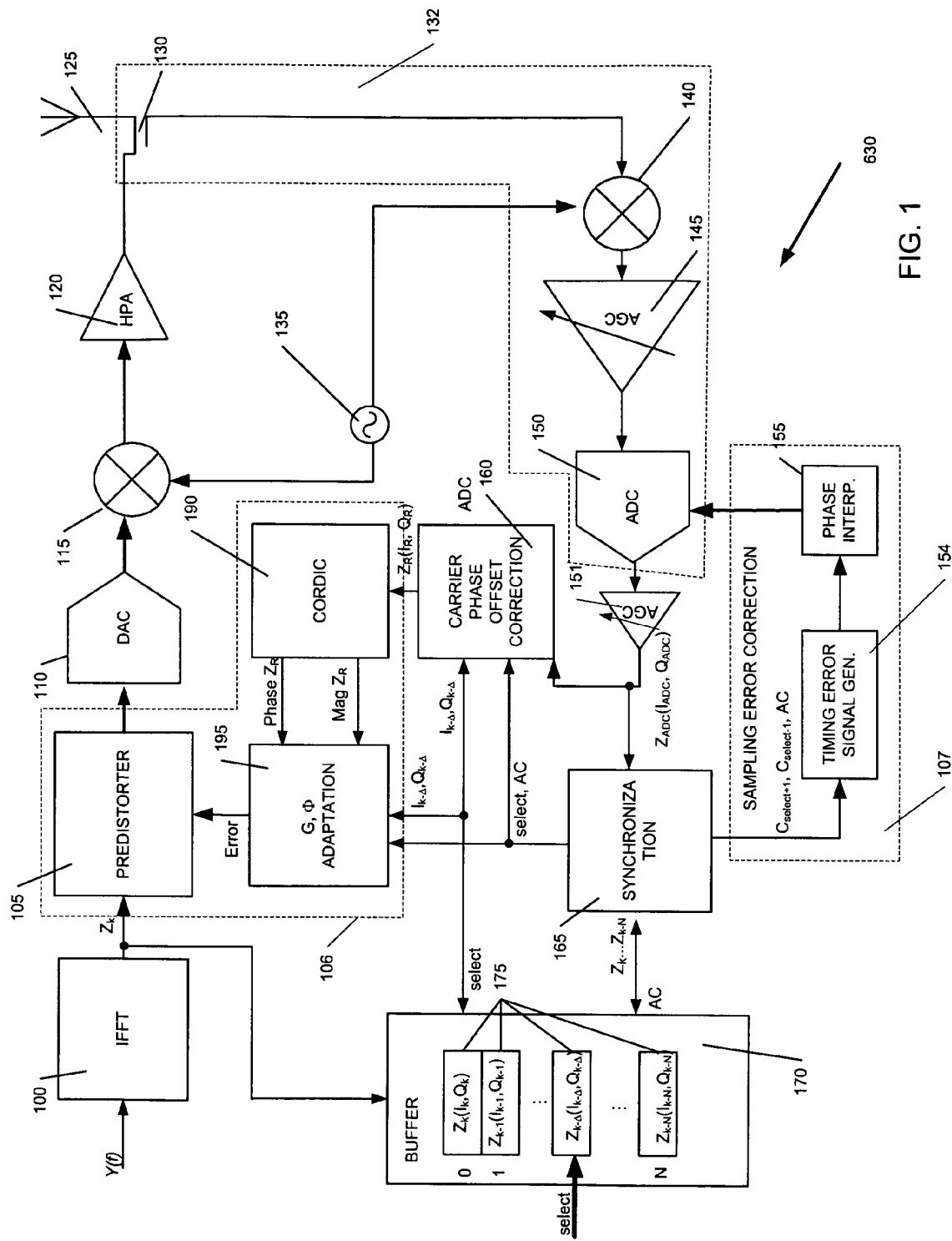
FIG. 1 is a block diagram of a linearizing amplifier according to a first embodiment of the invention.

Turning first to FIG. 1, FIG. 1 depicts a linearizing amplifier 630 according to a first embodiment of the invention. Here, though not required as will be appreciated by those ordinarily skilled in the art, input signal Y(f) is presented as a multi-carrier OFDM-encoded digital signal waveform compliant with IEEE 802.11a (1999) and Draft IEEE 802.11g (2002) transmission rate standards This input signal Y(f) presents data intended for modulation, amplification and transmission in analog form consistent with these IEEE 802.11a and 802.11g standards.

An inverse fast Fourier transform ("IFFT") unit 100 converts the frequency domain input signal Y(f) into a corresponding baseband digital waveform in the time domain as is well known in the art on a per sample basis. As shown in FIG. 1, the output of the IFFT 100 per unit time is shown as complex waveform sample $Z_k$, and referred to generically herein as input signal samples or input samples. Specific input samples processed by the IFFT 100 preceding $Z_k$ in time are denoted herein relative to $Z_k$. Consider, for example, $Z_{k-x}$, where x represents the number of time units that the sample $Z_{k-x}$ precedes sample $Z_k$. Consistent with the IEEE 802.11a and 802.11g standards, synchronous digital components of the signal processing apparatus of the linearizing amplifier 630, including the IFFT 100, the predistortion unit 106, the buffer 170, the synchronization unit 165, the timing recovery unit 107, the phase-shift correction unit 160 and converters 110, 150 operate from a common 40 MHz clock (not shown), although in other transmission applications, such clock synchronization need not exist or operate at different or differing frequencies as long as their function remains consistent with the teachings of the present invention. Thus, the unit time in this embodiment is 25 ns.

Still referring to FIG. 1, $Z_k$ is then fed to predistorter 105 of the predistortion unit 106 which performs amplitude-amplitude and amplitude-phase distortion with reference to a distortion correction function (labeled ERROR in FIG. 1) generated by the gain & phase adaptation unit order to compensate for the nonlinear effects of the high power amplifier 120 and consequent distortion components it may introduce. As will be discussed in more detail below, the distortion correction function according to this embodiment is calculated by comparing a time domain input sample preceding $Z_k$ which corresponds most closely to a self-received signal $Z_{ADC}$ perceived by the self-receiver 132 while $Z_k$ undergoes selective predistortion correction. This preceding input sample will be referred herein as the matching input sample or Zk–Δ wherein Δ represents the index into the buffer 170 where the matching input sample is stored (at address select within the buffer 170), or the number of clock cycles representing the delay between the input to the predistorter 105 and the output of the self-receiver 132. For example, a Δ value of 8 would mean that the corresponding input sample would be 8 locations deep into the buffer 170, and assuming a clock rate of 40 MHz, the linearizing amplifier 630 would be exhibiting a 8*25 ns or 200 ns delay between the input and self-received signal.

In order to properly apply predistortion correction to linearize the response of a nonlinear amplifier such as the high power amplifier 120 of the present embodiment, comparison between the input signal and the output signal of the high power amplifier needs to be performed. In fact, for best performance in high speed transmission systems requiring relatively high peak-to-average ratios, such as that encountered in multi-carrier wireless applications including IEEE 802.11a and 802.11g compliant systems, it is desirable that the comparison be made of matching input and output signals relative to time. In other words, it is desirable that the output signal from the amplifier is compared to its corresponding input signal prior to predistortion correction. A self-receiver communicatively coupled to the output of the power amplifier is commonly used to receive, attenuate and condition the output signal of the amplifier as a self-receive signal for input signal comparison purposes.

Because of the nature of the involved transmission and self-reception circuitry, it is well known that a implementation-specific and potentially varying delay exists between the predistorter input and the self-receiver output in current adaptive predistortion systems which should be accounted for in order to match the input and output signals. Known adaptive predistortion systems appear to account for this delay, but almost universally do so on an implementation specific basis, which apparently takes into account: 1) specific implementation component delays (such as that introduced by selected FIR filtering mechanisms used to condition the result of digital-to-analog and analog-to-digital conversion); and 2) iterative feedback trial-and-error verification and modification when placing these selected components into a predistortion design. Moreover, it is believed that these delay design considerations assume a static delay response characteristic of the predistortion system, which tends to oversimplify if not disregard the effects of variable delays brought on input/output signal variation, not to mention component aging and environmental effects such as operating temperature, etc.

However, consistent with the present invention, a dynamic approach is taken with respect to the present embodiment that focuses attention away from specific component characteristics, delay assumptions, and trial-and-error and instead uses a combination of a plurality of input samples stored over time in combination with correlation function properties in order to find the experienced time delay between the input signal and the self-received signal. This delay may change over a number of correlation iterations over time until convergence is reached, or alternatively after a certain number of correlation iterations have occurred.

As shown in FIG. 1, in this particular embodiment, in order to match a realized sample of self-received signal ($Z_{ADC}$) generated by the self-receiver 132 with its corresponding (and previously occurring) input signal sample prior to selective predistortion correction by the predistorter 105, the signal prior to predistortion, a buffer 170 coupled to the output of the IFFT and the input of the predistorter 105 to store a given number of input samples. This buffer is of sufficient depth (N) in view of the digital clock rate of the linearizing amplifier 630 in order to accommodate for worst case delays between the input of the predistorter 105 and the digital output of the self-receiver 132, shown in FIG. 1 occurring at the output of analog-to-digital converter 150, although in an alternative embodiment, the depth could be limited to one reasonably likely to account for such delay. In either event, the depth of the buffer 170 is such that the input sample corresponding most closely to the realized output signal of the self-receiver 132 is at least reasonably likely to still be contained in the buffer 170.

The buffer 170 can conveniently comprise a shift register or FIFO with persistent parallel access to stored contents. Moreover, in this embodiment, each memory location 175 in buffer 170 will be able to store at least in-phase ("I") and quadrature phase ("Q") components of a given input sample generated by the IFFT 100.

In this embodiment, the realized sample of the self-received signal are synchronized through correlating this realized sample against the contents of the buffer 170. To this end, a synchronization unit 165 is provided that, during its active phase as will be discussed in more detail with reference to FIG. 2, the synchronization unit 165 will take the I and Q components of this stored transmit signals $Z_k \ldots Z_{k-N}$, derive the magnitude for each of the stored transmit signals $Z_k \ldots Z_{k-N}$, and correlate the generated magnitudes against the magnitude of the realized sample of self-received signal ($|Z_{ADC}|$). This self-received signal is subject to a potential static carrier phase offset which should be corrected in order to more accurately generate the distortion correction function, thus a carrier phase offset correction unit 160 is provided to perform the same as needed.

Figure 3:
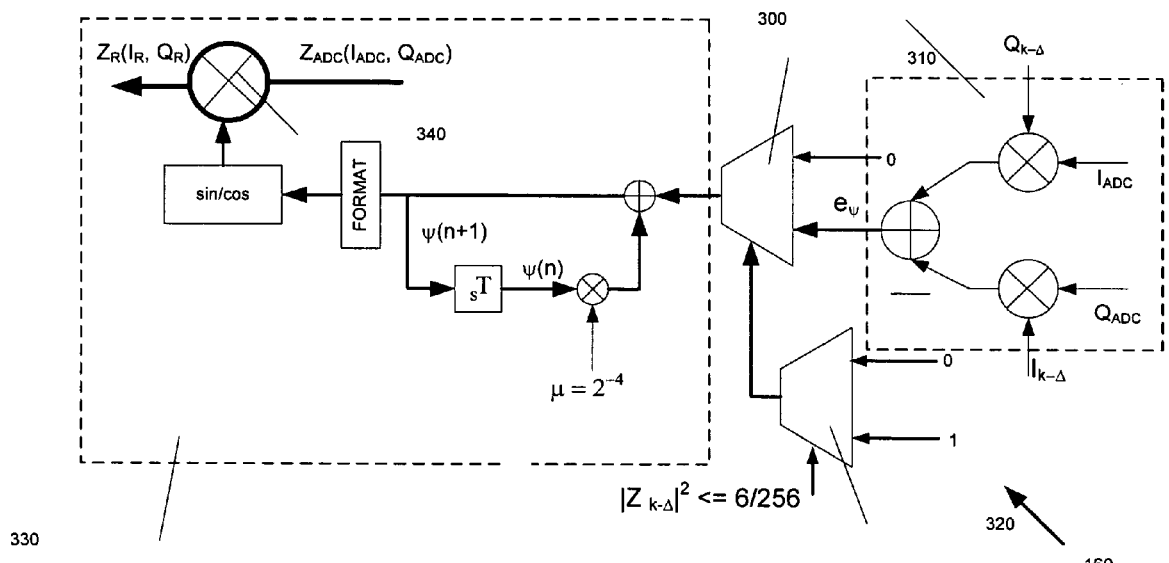
FIG. 3 is a more detailed block diagram of the phase-shift correction unit 160 shown in FIG. 1.

More detail on carrier phase offset correction according to the present embodiment will be discussed below with reference to FIG. 3. However, the magnitude needs no further correction, and thus the magnitude of $Z_{ADC}$ may be used. Therefore, potential delay in realization of the self-received signal caused by the carrier phase offset correction unit 160 alone or in combination with the Coordinate Rotation Digital Computer or "CORDIC" 190 may be avoided. Though not shown in FIG. 1, alternative embodiments may utilizes the self-received signal after carrier phase offset correction by the carrier phase offset correction unit 160 and possibly even post magnitude and phase realization via the CORDIC 190 for comparison purposes. If delays introduced by the carrier phase offset correction unit 160 and CORDIC 190 can be accounted for by, e.g. further increasing the depth of the buffer 170, this arrangement may simplify design of the synchronization unit 165 by eliminating the need for a separate magnitude calculation of $Z_{ADC}$, since Mag $Z_R$ (a.k.a. $|Z_R|$) produced by the CORDIC 190 is equivalent. thus allowing the magnitude calculated by the core deck 190 to be shared between the adaptation unit 195 and the synchronization unit 165.

Although not required, in the embodiment shown in FIG. 1, the AGC 145 is a relatively coarse gain controller suitable for a wide range of attenuation and amplitude control activities to normalize the self-received signal to nominal amplitude to ensure proper analog-to-digital translation by the ADC 150. To further improve small signal gain estimation and synchronization activities consistent with the current embodiment, a relatively fine resolution automatic gain control unit 151 is provided coupled to the output of the ADC 150 to boost its signal output towards the ADC built-in limits.

Once the magnitudes for the realized sample of the self-received signal and the stored input samples are calculated, the synchronization unit 165 of the embodiment shown in FIG. 1 will then correlate the input sample magnitudes $|Z_k \ldots Z_{k-N}|$ using $|Z_{ADC}|$ as a reference and then determine which input sample most closely corresponds to or matches the realized sample of the self-received signal. This is known as the matching input sample, and is denoted in the figures as $Z_{k-\Delta}$ or $Z_{select}$. More details on such correlation will be discussed below with reference to FIG. 2.

After correlation has been performed, the synchronization unit 165 shown in FIG. 1 will then identify a pointer (select) into the buffer 170 whose contents include the I and Q values for the matching input sample. This pointer is sent to the phase-shift correction unit 160 and the adaptation unit 195 so that they in turn can access the matching input sample values directly from buffer 170 to perform phase-shift correction and predistortion function generation in accordance with the present embodiment. This configuration eases transition of the signal processing apparatus when a converged state has been reached. Alternatively, though not shown in the figures, the index $\Delta$ or the I, Q values of the matching input sample themselves may be provided.

Also as noted in FIG. 1, the synchronization unit 165 also issues a binary semaphore AC to the aforementioned adaptation unit 195, phase-shift correction unit 160 as well as the sampling error correction unit 155 to indicate when input sample-self-receive sample comparison is actually being performed consistent with the present embodiment. More specifically, if AC is asserted high by the synchronization unit 165, this indicates that the synchronization unit is active and that the select pointer identified by the synchronization unit is subject to revision. Thus, the adaptation unit 195 and the phase-shift correction unit 160 will utilize the contents of buffer 170 specified by the select pointer as it is being potentially revised or updated by the synchronization unit 165.

However, in this embodiment, a false assertion of the AC semaphore indicates that the synchronization unit 165 is no longer actively comparing the contents of buffer 170 against the realized sample of the self-received signal, having previously determined or assumed that a convergence in the delay between the self-received signal and the input signal has occurred. Therefore, in this embodiment, upon detection that the AC semaphore is false, the adaptation unit 195 and the phase-shift correction unit 160 will use the last select pointer transmitted by the synchronization unit 165 before the AC semaphore transitioned to false. Though not shown in the figures, suitable logic and a falling edge triggered latch or other memory may be used to retain this value while the synchronization unit is inactive and the AC semaphore is false. Once the delay between the transmit and the self-received signal is identified which in this embodiment is done by the synchronization unit determining how deep in the buffer 170 to look to find the transmit signal that matches the self-received signal at a given unit time.

Still referring to FIG. 1, after predistortion correction function generation performed by the adaptation unit 195 and selective application of this function to the input sample $Z_k$, this input sample is then converted into baseband analog form consistent with physical layer requirements of the IEEE 802.11a and 802.11g standards by the digital-to-analog converter 110 and RF modulated by the appropriate carrier frequency by the up converter 115. Thereafter the RF modulated and selectively predistorted input signal is amplified by the nonlinear amplifier 120 and broadcast via RF antenna 125. Predistortion correction consistent with the present embodiment thereafter continues in time with the next ($Z_{k+1}$) and subsequent IFFT 100 generated samples of Y(f).

The self-receiver 132 of the linearizing amplifier unit 630 of FIG. 1 begins with RF coupler 130 to receive and attenuate the output of the high performance amplifier 120, and then relay the received attenuated RF signal and down convert it to analog baseband form by the down converter 140. Next, the down converted but still analog signal goes through further attenuation, filtering and conditioning in a known matter as it passes through the automatic gain control circuit 145 and then finally on to the analog-to-digital converter to recover the self-received signal in digital form suitable for comparison with the input samples.

It should be noted that, in this embodiment, the RF up converter 115 and the RF down converter 140 utilize a common local oscillator 135 thereby eliminating the need to compensate for potential frequency drift between the transmit and self-receive signal paths. This aspect is further strengthened by the design choice of physically placing the transmit and self-receiver units of the linearizing amplifier in close physical proximity such as on a common substrate, board or chip. It should be realized, however, that frequency drift compensation is well-known in the art, and that separate transmit and self-receive oscillators may be used which may indeed impart frequency errors but nevertheless do not depart from the teachings of the invention. For example, instead of using first order feedback loops in the common oscillator case described above, higher order effects can be corrected using corresponding higher order feedback loops as will be appreciated by those ordinarily skilled in the art.

Figure 2:
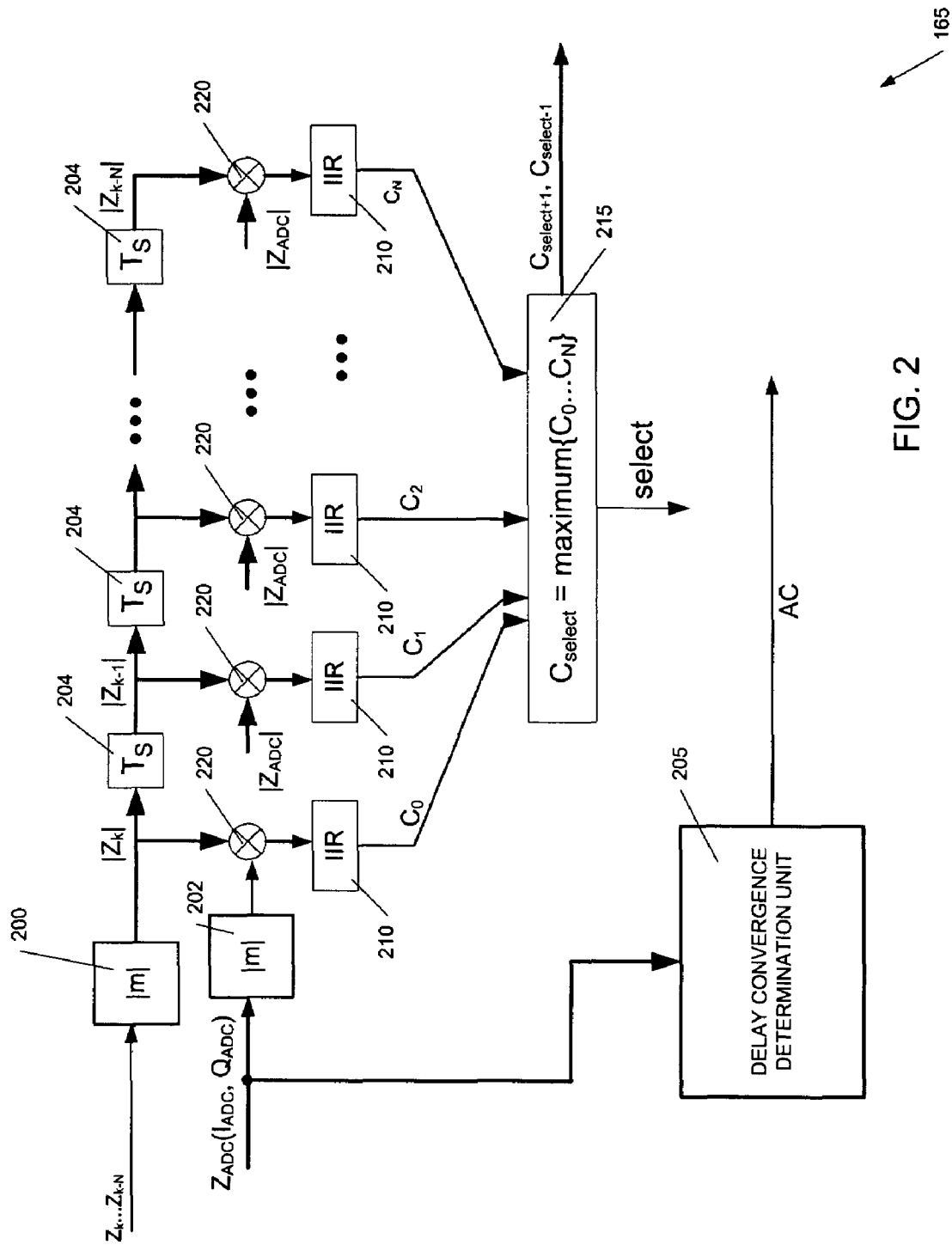
FIG. 2 is a more detailed block diagram of the auto correlation unit 165 shown in FIG. 1.

More detail on the synchronization unit 165 will be discussed hereinbelow with reference to FIG. 2. FIG. 2 illustrates a more detailed block diagram of the synchronization unit 165 initially shown in FIG. 1. As shown in FIG. 2, a magnitude generation unit 200 is used to convert the stored I and Q values for the stored input samples from time k-N to present (k) into corresponding magnitudes and store these magnitudes in shift register 204 from oldest to newest in sequence. Likewise, the magnitude generation unit 202 is used to determine the magnitude of the realized sample of the self-received signal.

Once all magnitudes for the stored input samples are determined (i.e. $|Z_k| \ldots |Z_{k-N}|$ are known), they are scalar multiplied in parallel by the magnitude of the self-received signal ($|Z_{ADC}|$ in order to find a correspondence between the stored input samples and the realized sample of the self-received signal. The result of the scalar multiplication are filtered and stored in a bank of one pole IIR filters 210 as shown in FIG. 2. Thereafter, the correlation circuit logic 215 will find the maximum scalar product contained in the IIR filter bank 210 and determine both the index Δ into the buffer whose correlation result is perceived to be at a maximum as the matching input sample. The correlation circuit logic 215, having knowledge of the starting address of the buffer 170 and Δ, determines the select pointer into the buffer containing the starting address defining the matching input sample.

As shown in the figures, the correlation circuit logic 215 of the synchronization unit 165 also passes on the immediately preceding and immediately proceeding correlation values ($C_{select-1}$, $C_{select+1}$ respectively in the figures) contained in the IIR bank 210 to the sampling error correction unit 107. As will be discussed in more detail herein with reference to FIG. 5, the immediately preceding and immediately proceeding correlation values are delivered to the sampling error correction unit 107 in order to generate a timing error signal used selectively used to correct potential sampling errors introduced by the analog-to-digital converter 150 as a result of a sampling phase which operates independently of the transmitter digital-to-analog converter 110. This results in even more accurate comparison between the corrected self-received signal and the corresponding input sample.

Still referring to FIG. 2, the delay convergence determination unit 205 is shown as part of the synchronization unit 165 in order to determine when correlation processing described above should be performed. In this embodiment, delay convergence is presumed after a certain number of correlation iterations have occurred (e.g., 30 packets into an 80 packet frame of 802.11a or 802.11g formatted data) and thus would monitor the self-received signal $Z_{ADC}$ and assert AC for only the first 30 packets into the current frame of data. In an alternative embodiment, delay convergence can actually be determined based on historical analysis of the select pointer or index Δ to follow trends towards convergence to a reference value, using well known convergence analysis techniques. Once delay convergence is reached and using this or other known techniques as well be appreciated by those ordinarily skilled in the art, the AC semaphore is then asserted false by the delay convergence determination unit 205 in this embodiment so that the converged select pointer is maintained for an appropriate time (e.g. until the end of the current packet has been reached) within the aforementioned memory of the adaptation unit 195 and the phase-shift correction unit 160.

Carrier phase offset correction in accordance with the present embodiment is now detailed with reference to FIG. 3. As shown in FIG. 3, carrier phase offset errors are corrected using a known decision-directed maximum likelihood detector arrangement 300, 310, 320 and 330 in which decisions of received samples are the corresponding transmitted samples.

Figure 4:
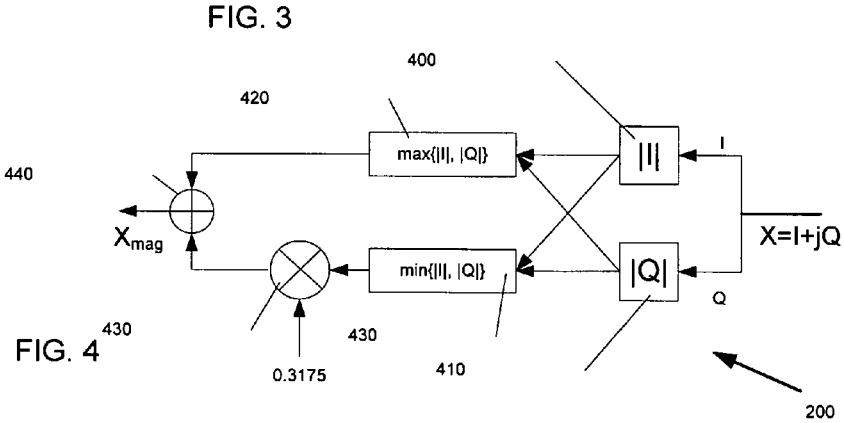
FIG. 4 is a more detailed block diagram of the magnitude generator 200 shown in FIG. 2.

FIG. 4 is a more detailed block diagram of the magnitude determination unit 200 shown in FIG. 2. This unit comprises well understood techniques for approximating the magnitude of a given complex form digital signal based on the I and Q values corresponding to such signal. Other techniques may be used to arrive at the same result, as would be understood by those ordinarily skilled in the art.

Figure 5:
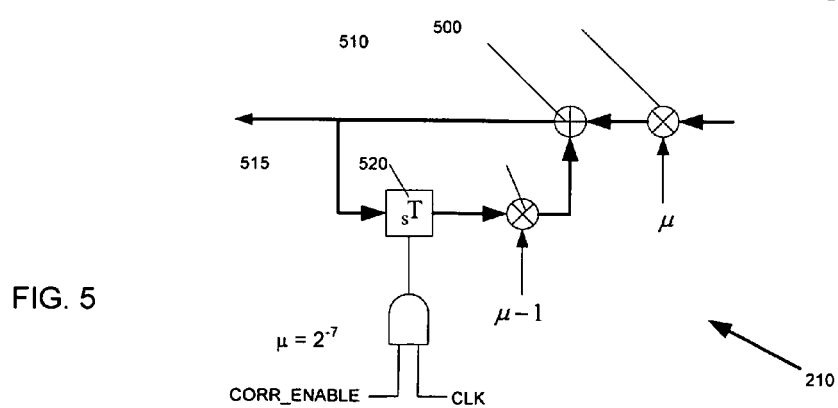
FIG. 5 is a more detailed block diagram of one of the IIR filters 210 shown in FIG. 2.

FIG. 5 is a more detailed block diagram of the IIR filter 210 used to store the correlation results of a given transmit signal against the self-received signal. The IIR filter 210 smooths the signal by reducing inherent self-noise in the data.

Figure 7:
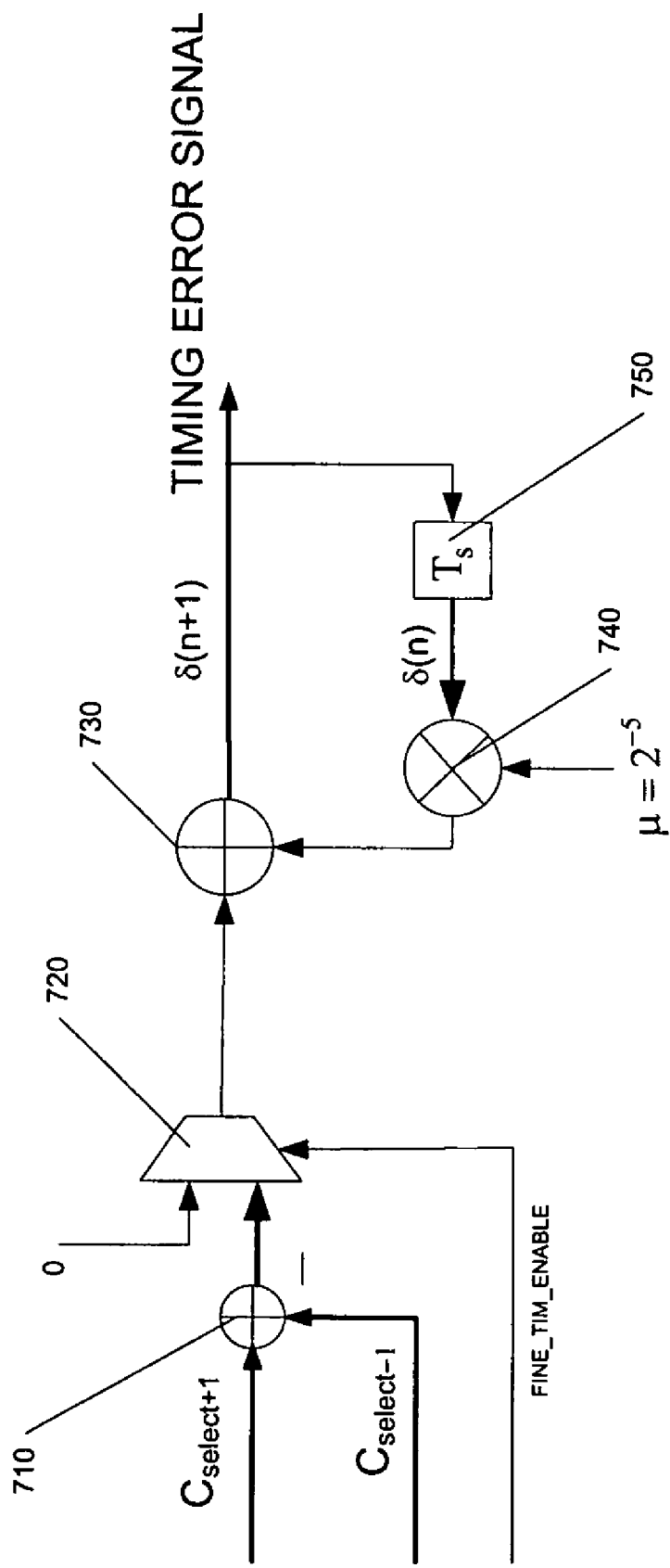
FIG. 7 is a block diagram of the timing error generation circuit 154 shown in FIG. 1.

FIG. 7 depicts a timing error generation unit 154 forming part of the sampling error correction unit 107 shown in FIG. 1. It should be realized that the error signal is generated with reference to correlation values Cselect+1, Cselect−1 found by the synchronization unit 165 described hereinabove, and that known timing recovery techniques are implemented in this embodiment with reference to this error to control a conventional phase interpolator 155 which, in turn, adjusts sampling of the analog-to-digital converter 150 in a known manner.

Figure 6:
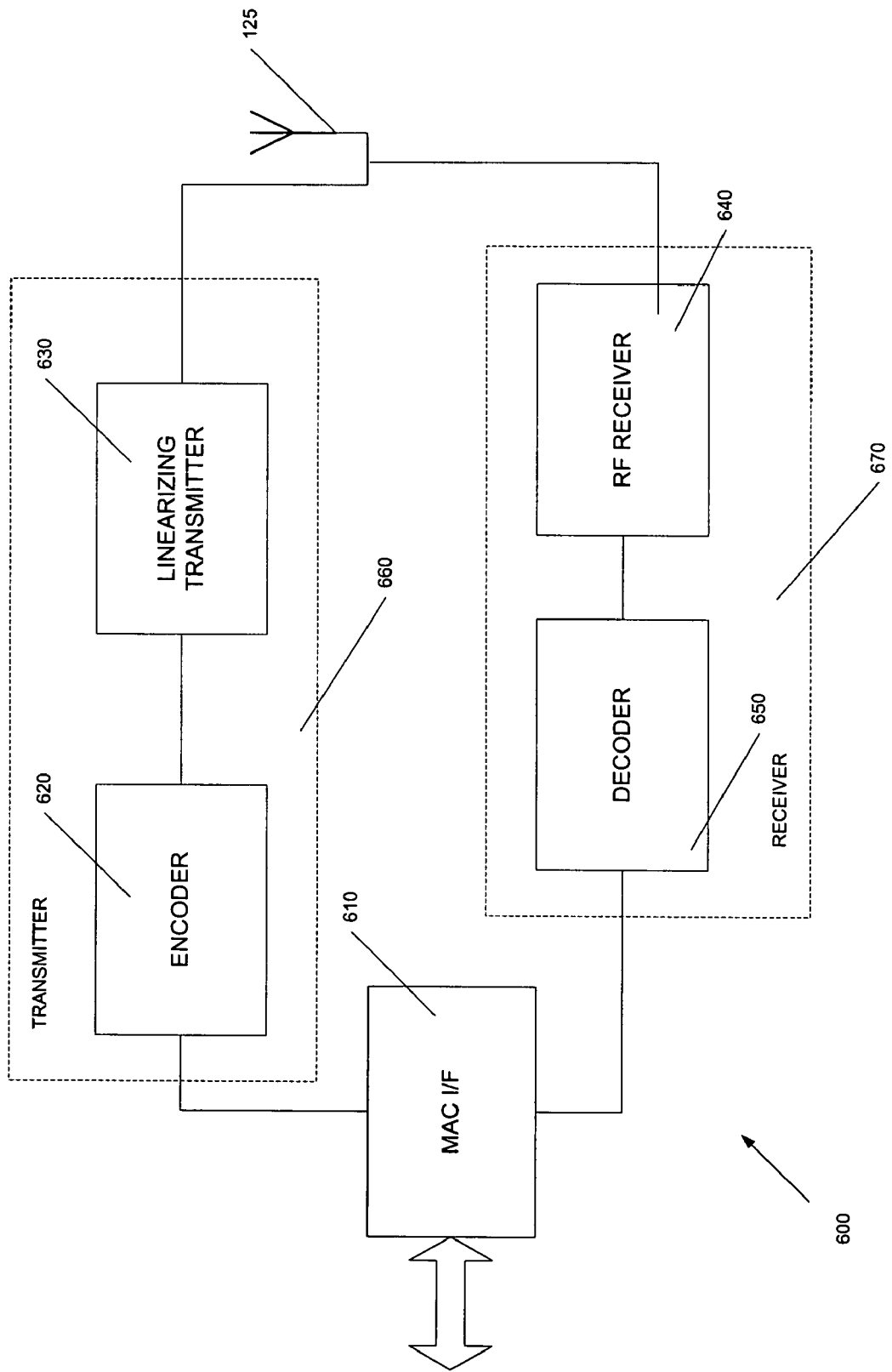
FIG. 6 is a simplified block diagram of a wireless transceiver consistent with the first embodiment of the invention.

FIG. 6 illustrates a wireless communications transceiver 600 consistent with the present embodiment which incorporates linearizing amplifier 630 of FIG. 1 as part of a greater transmitter 660 arranged in accordance with IEEE 802.11a and 802.11g standards. Specifically, the linearizing amplifier 630, including the self-receiver 132 forms part of the transmitter portion 660 of the transceiver 600 along with base band encoder 620. Though not required, the receiver 670 and the transmitter 660 share a common RF antenna 125 for broadcasting and reception operations and an OSI layer 2+ MAC interface 610 as a type of network interface to transfer data of interest between the transceiver and higher layer processes and applications serviced by the transceiver 600. Though not shown in FIG. 6, the transceiver 600 may form an operational part of a network interface apparatus such as a PC Card capable of interfacing with the CPU or information processor of an information processing apparatus such as a desktop or laptop computer, integrated directly within such information processing apparatus, or form an operational component of a wireless communications access point such as a base station as will be appreciated by those ordinarily skilled in the art.

Figure 8:
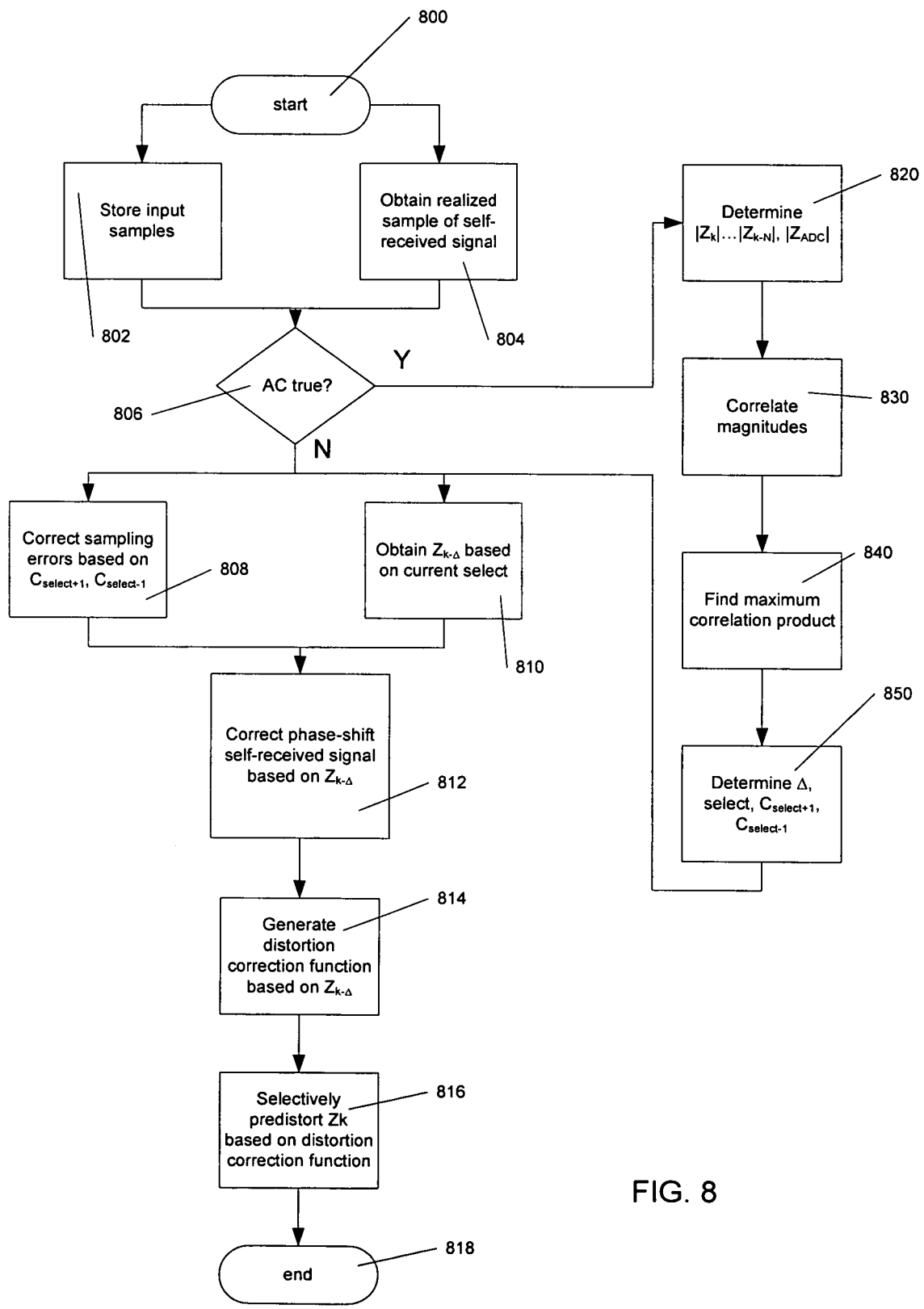
FIG. 8 is a flowchart illustrating signal processing according to an alternative embodiment of the invention.

FIG. 8 is a flowchart describing predistortion signal processing according to an alternative embodiment of the invention. In this embodiment, predistortion symbol processing may be performed by an ASIC and/or a programmed information processor such as a microprocessor, or microcontroller as well as a digital signal processor designed to execute the sequence of steps described in the flowchart of FIG. 8, and or any subset thereof in combination with one or more components of the linearizing amplifier 630 described above.

It will be obvious to those having skill in the art that many changes may be made to the details of the above-described embodiments of this invention without departing from the underlying principles thereof. The scope of the present invention should, therefore, be determined only by the following claims.

What is claimed is:

1. A distortion correction circuit, comprising:
   memory that stores N samples of an input signal that occur at N different times, where N is an integer greater than two;
   a self-receiver that samples an output signal that is generated by an RF power amplifier and that is based on said input signal;
   a synchronization unit that selects one of said N samples by comparing said sampled output signal to said N samples; and
   a predistortion unit that generates a distortion correction function based on said selected one of said N samples and said output signal.

2. The distortion correction circuit of claim 1 wherein said predistortion unit applies said distortion correction function to said input signal.

3. The distortion correction circuit of claim 2 further comprising a sampling phase error correction unit that provides sampling alteration information to said analog-to-digital converter, wherein said analog-to-digital converter selectively alters sampling of said output signal based on said sampling alteration information.

4. The distortion correction circuit of claim 3 wherein said correlation unit generates a first correlation result for a first one of said N samples immediately preceding said selected one of said N samples in said memory, and generates a second correlation result for a second one of said N samples immediately following said selected one of said N samples in said memory, wherein said sampling phase error correction unit generates said sampling alteration information based on a relationship between said first and second correlation results.

5. The distortion correction circuit of claim 1 wherein said self-receiver includes an analog-to-digital converter that converts said output signal to a digital output signal.

6. The distortion correction circuit of claim 5 wherein said synchronization unit comprises a correlation unit that correlates a characteristic of said N samples relative to a similar characteristic of said output signal.

7. The distortion correction circuit of claim 6 wherein said characteristic comprises a magnitude.

8. The distortion correction circuit of claim 6 further comprising a sampling phase error correction unit that provides sampling alteration information to said analog-to-digital converter.

9. The distortion correction circuit of claim 8 wherein said correlation unit generates a first correlation result for a first one of said N samples immediately preceding said selected one of said N samples in said memory, generates a second correlation result for a second one of said N samples immediately following said selected one of said N samples in said memory, wherein said sampling phase error correction unit generates said sampling alteration information based on a relationship between said first and second correlation results.

10. The distortion correction circuit of claim 5 further comprising a phase offset correction unit that corrects a phase offset of said output signal relative to said selected one of said N samples.

11. The distortion correction circuit of claim 10 wherein said predistortion unit comprises an adaptation unit that derives said distortion correction function based on a relationship between said selected one of said N samples and said phase offset.

12. The distortion correction circuit of claim 1 wherein said synchronization unit comprises a convergence determination unit that determines when a convergence condition has occurred with respect to determination of said selected one of said N samples.

13. The distortion correction circuit of claim 1 wherein said synchronization unit comprises a correlation unit that correlates a characteristic for said N samples against a similar characteristic of said output signal.

14. A distortion correction circuit, comprising:
   storing means for storing N samples of an input signal that occur at N different times, where N is an integer greater than two;
   self-receiving means for sampling an output signal that is generated by an RF power amplifier and that is based on said input signal;
   synchronization means for selecting one of said N samples by comparing said sampled output signal to said N samples; and
   predistortion means for generating a distortion correction function based on said selected one of said N samples and said output signal.

15. The distortion correction circuit of claim 14 wherein said predistortion means applies said distortion correction function to said input signal.

16. The distortion correction circuit of claim 15 further comprising sampling phase error correction means for providing sampling alteration information to said analog-to-digital converter, wherein said analog-to-digital converter selectively alters sampling of said output signal based on said sampling alteration information.

17. The distortion correction circuit of claim 16 wherein said correlation means generates a first correlation result for a first one of said N samples immediately preceding said selected one of said N samples in said storing means, and generates a second correlation result for a second one of said N samples immediately following said selected one of said N samples in said storing means, wherein said sampling phase error correction means generates said sampling alteration information based on a relationship between said first and second correlation results.

18. The distortion correction circuit of claim 14 wherein said self-receiving means includes analog-to-digital converting means for converting said output signal to a digital output signal.

19. The distortion correction circuit of claim 18 wherein said synchronization means comprises correlation means for correlating a characteristic of said N samples relative to a similar characteristic of said output signal.

20. The distortion correction circuit of claim 19 wherein said characteristic comprises a magnitude.

21. The distortion correction circuit of claim 19 further comprising sampling phase error correction means for providing sampling alteration information to said analog-to-digital converter.

22. The distortion correction circuit of claim 21 wherein said correlation means generates a first correlation result for a first one of said N samples immediately preceding said selected one of said N samples in said storing means, generates a second correlation result for a second one of said N samples immediately following said selected one of said N samples in said storing means, wherein said sampling phase error correction means generates said sampling alteration information based on a relationship between said first and second correlation results.

23. The distortion correction circuit of claim 18 further comprising phase offset correction means for correcting a phase offset of said output signal relative to said selected one of said N samples.

24. The distortion correction circuit of claim 23 wherein said predistortion means comprises adaptation means for deriving said distortion correction function based on a relationship between said selected one of said N samples and said phase offset.

25. The distortion correction circuit of claim 14 wherein said synchronization means comprises convergence determination means for determining when a convergence condition has occurred with respect to determination of said selected one of said N samples.

26. The distortion correction circuit of claim 14 wherein said synchronization means comprises correlation means for correlating a characteristic for said N samples against a similar characteristic of said output signal.

27. A method for operating a distortion correction circuit, comprising:
   storing N samples of an input signal that occur at N different times, where N is an integer greater than two;
   sampling an output signal that is generated by an RF power amplifier and that is based on said input signal;
   selecting one of said N samples by comparing said sampled output signal to said N samples; and
   generating a distortion correction function based on said selected one of said N samples and said output signal.

28. The method of claim 27 further comprising applying said distortion correction function to said input signal.

29. The method of claim 28 further comprising:
   providing sampling alteration information; and
   selectively altering sampling of said output signal based on said sampling alteration information.

30. The method of claim 29 further comprising:
   generating a first correlation result for a first one of said N samples immediately preceding said selected one of said N samples;
   generating a second correlation result for a second one of said N samples immediately following said selected one of said N samples;
   generating said sampling alteration information based on a relationship between said first and second correlation results.

31. The method of claim 27 further comprising converting said output signal to a digital output signal.

32. The method of claim 31 further comprising correlating a characteristic of said N samples relative to a similar characteristic of said output signal.

33. The method of claim 32 wherein said characteristic comprises a magnitude.

34. The method of claim 32 further comprising providing sampling alteration information to said analog-to-digital converter.

35. The method of claim 34 further comprising:
   generating a first correlation result a first one of said N samples immediately preceding said selected one of said N samples in said memory;
   generating a second correlation result for a second one of said N samples immediately following said selected one of said N samples in said memory; and
   generating said sampling alteration information based on a relationship between said first and second correlation results.

36. The method of claim 31 further comprising correcting a phase offset of said output signal relative to said selected one of said N samples.

37. The method of claim 36 further comprising deriving said distortion correction function based on a relationship between said selected one of said N samples and said phase offset.

38. The method of claim 27 further comprising determining when a convergence condition has occurred with respect to determination of said selected one of said N samples.

39. The method of claim 27 further comprising correlating a characteristic for said N samples against a similar characteristic of said output signal.

* * * * *

UNITED STATES PATENT AND TRADEMARK OFFICE
CERTIFICATE OF CORRECTION

PATENT NO. : 7,362,821 B1  Page 1 of 1
APPLICATION NO. : 11/412637
DATED : April 22, 2008
INVENTOR(S) : Kedar Shirali It is certified that error appears in the above-identified patent and that said Letters Patent is hereby corrected as shown below:

| | |
|---|---|
| Column 2, Line 4 | Delete "an" and insert -- a -- |
| Column 6, Line 9 | Delete "utilizes" and insert -- utilize -- |
| Column 8, Line 13 | Insert -- ) -- after "$\|Z_{ADC}\|$" |
| Column 8, Line 35 | Delete "used" after "selectively" |
| Column 8, Line 56 | Delete "well" and insert -- will -- |
| Column 12, Line 56 | Insert -- for -- after "results" |

Signed and Sealed this

Twenty-fourth Day of March, 2009

JOHN DOLL
*Acting Director of the United States Patent and Trademark Office*